(12) United States Patent (10) Patent No.: US 8,199,590 B1
Novosel et al. (45) Date of Patent: Jun. 12, 2012

(54) MULTIPLE TIME PROGRAMMABLE NON-VOLATILE MEMORY ELEMENT

(75) Inventors: Walter Novosel, New Wilmington, PA (US); Ethan Sieg, Hermitage, PA (US); Timothy Fiscus, Hermitage, PA (US); David Novosel, New Wilmington, PA (US); Elaine Novosel, legal representative, West Middlesex, PA (US)

(73) Assignee: Novocell Semiconductor, Inc., Hermitage, PA (US)

( * ) Notice: Subject to any disclaimer, the term of this patent is extended or adjusted under 35 U.S.C. 154(b) by 0 days.

(21) Appl. No.: 12/889,653

(22) Filed: Sep. 24, 2010

Related U.S. Application Data

(60) Provisional application No. 61/244,791, filed on Sep. 25, 2009.

(51) Int. Cl.
 *G11C 7/00* (2006.01)
(52) U.S. Cl. .............................. 365/189.2; 365/230.03
(58) Field of Classification Search ............... 365/189.2, 365/230.03
See application file for complete search history.

(56) References Cited

U.S. PATENT DOCUMENTS

| | | | |
|---|---|---|---|
| 4,800,297 A | 1/1989 | Novosel et al. | |
| 4,801,891 A | 1/1989 | Novosel et al. | |
| 4,874,965 A | 10/1989 | Campardo et al. | |
| 4,888,497 A | 12/1989 | Dallabora et al. | |
| 5,703,804 A | 12/1997 | Takata et al. | |
| 5,737,260 A | 4/1998 | Takata et al. | |
| 5,828,596 A | 10/1998 | Takata et al. | |
| 6,158,613 A | 12/2000 | Novosel et al. | |
| 6,175,262 B1 | 1/2001 | Savelli et al. | |
| 6,477,094 B2 | 11/2002 | Kim et al. | |
| 6,650,143 B1 | 11/2003 | Peng | |
| 6,667,902 B2 | 12/2003 | Peng | |
| 6,671,040 B2 | 12/2003 | Fong et al. | |
| 6,700,151 B2 | 3/2004 | Peng | |
| 6,766,960 B2 | 7/2004 | Peng | |
| 6,775,171 B2 | 8/2004 | Novosel et al. | |
| 6,775,197 B2 | 8/2004 | Novosel et al. | |
| 6,777,757 B2 | 8/2004 | Peng et al. | |
| 6,791,891 B1 | 9/2004 | Peng et al. | |
| 6,798,693 B2 | 9/2004 | Peng | |
| 6,816,427 B2 | 11/2004 | Novosel et al. | |
| 6,822,888 B2 | 11/2004 | Peng | |
| 6,856,540 B2 | 2/2005 | Peng et al. | |
| 6,888,398 B2 | 5/2005 | Koehl et al. | |
| 6,898,116 B2 | 5/2005 | Peng | |
| 6,924,664 B2 | 8/2005 | Wang | |
| 6,940,751 B2 | 9/2005 | Peng et al. | |
| 6,956,258 B2 | 10/2005 | Peng | |
| 6,972,986 B2 | 12/2005 | Peng et al. | |
| 6,992,925 B2 | 1/2006 | Peng | |
| 7,031,209 B2 | 4/2006 | Wang et al. | |
| 7,042,772 B2 | 5/2006 | Wang et al. | |

(Continued)

*Primary Examiner* — Michael Tran
(74) *Attorney, Agent, or Firm* — Lando & Anastasi, LLP

(57) ABSTRACT

A multiple time programmable non-volatile memory element and associated programming methods that allow for integration of non-volatile memory with other CMOS integrated circuitry utilizing standard CMOS processing. The multiple time programmable non-volatile memory element includes a capacitor, an access transistor that is electrically coupled to the capacitor at a connection node, and a plurality of one time programmable non-volatile memory cells. Each of the plurality of one time programmable non-volatile memory cells is electrically coupled to the connection node and includes a select transistor that is electrically coupled to an antifuse element. The antifuse element is configured to have changed resistivity in response to one or more voltage pulses received at the connection node, the change in resistivity representing a change in logic state.

14 Claims, 2 Drawing Sheets

U.S. PATENT DOCUMENTS

| | | |
|---|---|---|
| 7,173,851 B1 | 2/2007 | Callahan et al. |
| 7,269,047 B1 | 9/2007 | Fong et al. |
| 7,277,310 B2 * | 10/2007 | Yoon et al. .................. 365/63 |
| 7,402,855 B2 | 7/2008 | Kurjanowicz |
| 7,463,536 B2 * | 12/2008 | Scheuerlein et al. .... 365/189.18 |
| 7,471,540 B2 | 12/2008 | Luan et al. |
| 7,471,541 B2 | 12/2008 | Fong et al. |
| 7,511,982 B2 | 3/2009 | Kurjanowicz et al. |
| 7,586,787 B2 | 9/2009 | Vo et al. |
| 7,609,539 B2 | 10/2009 | Peng et al. |
| 7,623,368 B2 | 11/2009 | Luan |
| 7,642,138 B2 | 1/2010 | Kurjanowicz |
| 7,755,162 B2 | 7/2010 | Kurjanowicz et al. |
| 7,764,532 B2 | 7/2010 | Kurjanowicz et al. |
| 7,772,063 B2 | 8/2010 | Novosel |
| 7,817,456 B2 | 10/2010 | Kurjanowicz |
| 7,907,465 B2 | 3/2011 | Peng et al. |
| 2002/0075743 A1 | 6/2002 | Ooishi et al. |
| 2006/0232296 A1 | 10/2006 | Wang et al. |
| 2006/0233082 A1 * | 10/2006 | Lee et al. .................... 369/59.23 |
| 2007/0008800 A1 | 1/2007 | Jenne |
| 2008/0074915 A1 * | 3/2008 | Terzioglu et al. ............... 365/96 |
| 2009/0250726 A1 | 10/2009 | Kurjanowicz |
| 2009/0251943 A1 | 10/2009 | Kurjanowicz |
| 2009/0262566 A1 | 10/2009 | Kurjanowicz |
| 2009/0290434 A1 | 11/2009 | Kurjanowicz |
| 2010/0002527 A1 | 1/2010 | Kurjanowicz |
| 2010/0011266 A1 | 1/2010 | Kurjanowicz |
| 2010/0202183 A1 | 8/2010 | Kurjanowicz |
| 2010/0220511 A1 | 9/2010 | Kurjanowicz |
| 2010/0244115 A1 | 9/2010 | Kurjanowicz et al. |
| 2010/0259965 A1 | 10/2010 | Kurjanowicz et al. |
| 2011/0019491 A1 | 1/2011 | Kurjanowicz et al. |

* cited by examiner

MULTIPLE TIME PROGRAMMABLE NON-VOLATILE MEMORY ELEMENT

RELATED APPLICATIONS

This application claims priority under 35 U.S.C. §119(e) to U.S. Provisional Application Ser. No. 61/244,791, entitled "MULTIPLE TIME PROGRAMMABLE NON-VOLATILE MEMORY ELEMENT," filed on Sep. 25, 2009, which is herein incorporated by reference in its entirety. This application is related to U.S. application Ser. No. 12/887,956 entitled "NON-VOLATILE MEMORY ELEMENT INTEGRATABLE WITH STANDARD CMOS CIRCUITRY," filed on Sep. 22, 2010, and to U.S. application Ser. No. 12/889,659, entitled "METHOD OF SENSING A PROGRAMMABLE NON-VOLATILE MEMORY ELEMENT," filed on Sep. 24, 2010.

BACKGROUND OF INVENTION

Embodiments of the present invention relate to non-volatile memories, and more particularly, to embedded memories for combination with other integrated circuitry.

SUMMARY OF INVENTION

The present invention provides a non-volatile memory cell and associated programming methods that allow for the integration of non-volatile memory with other CMOS integrated circuitry utilizing the standard CMOS processing used to manufacture the other CMOS integrated circuitry. The non-volatile cell structure and programming methods of the present invention, therefore, provide a desirable solution for embedded memory architectures.

In accordance with an aspect of the present invention, a multiple time programmable non-volatile memory element is provided. The multiple time programmable non-volatile memory element comprises a capacitor, an access transistor that is electrically coupled to the capacitor at a connection node, and a plurality of one time programmable non-volatile memory cells. Each of the plurality of one time programmable non-volatile memory cells is electrically coupled to the connection node and includes a select transistor that is electrically coupled to an antifuse element. The antifuse element is configured to have changed resistivity in response to one or more voltage pulses received at the connection node, the change in resistivity representing a change in logic state.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
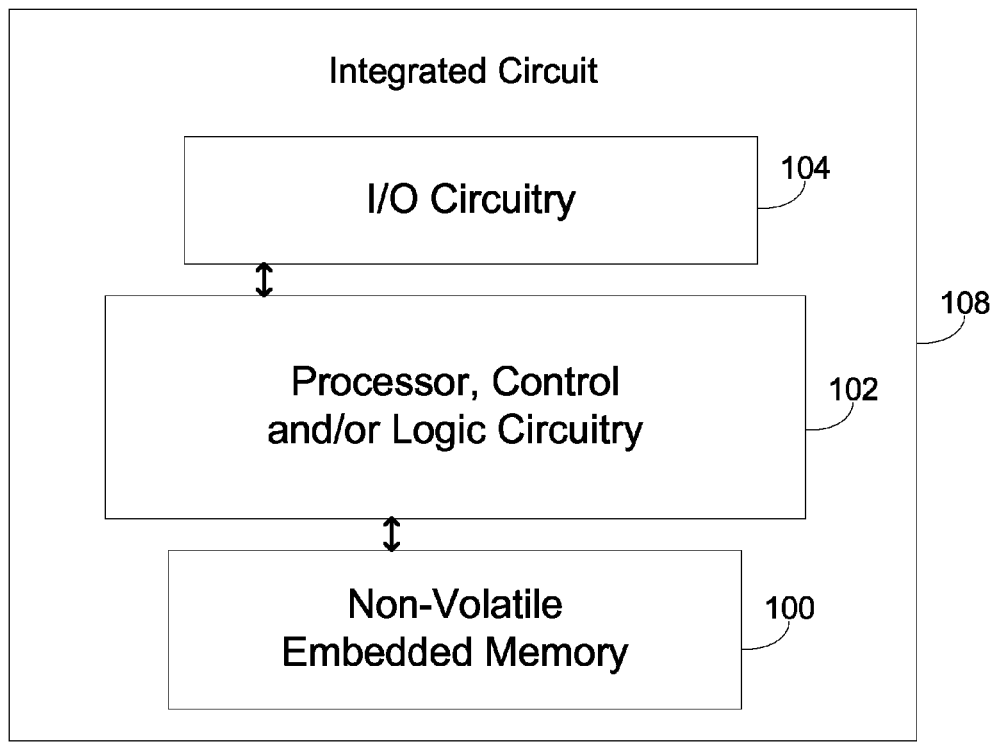
FIG. 1A is a block diagram of an integrated circuit including embedded non-volatile memory according to an aspect of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

The present invention provides non-volatile memory cell and associated programming methods that allow for the integration of non-volatile memory with other CMOS integrated circuitry utilizing the standard CMOS processing used to manufacture the other CMOS integrated circuitry. Thus, the non-volatile cell structure and programming methods, therefore, provide a desirable solution for embedded memory architectures.

FIG. 1A is a block diagram for an integrated circuit 108 including embedded non-volatile memory 100 according to an aspect of the present invention. As discussed in more detail below, the non-volatile memory cell architecture of the present invention lends itself to being manufactured using standard CMOS processing. Thus, rather than requiring additional processing steps or post processing combination, the embedded non-volatile memory of the present invention can be fabricated at the same time the other circuitry is being fabricated. As such, the integrated circuit 108 can include a wide variety of other circuitry as represented by input/output (I/O) circuitry 104 and processor, control and/or logic circuitry 102. It is noted, therefore, that the actual circuitry fabricated with the embedded non-volatile memory 100 could vary depending upon the operational functionality desired.

Figure 1B:
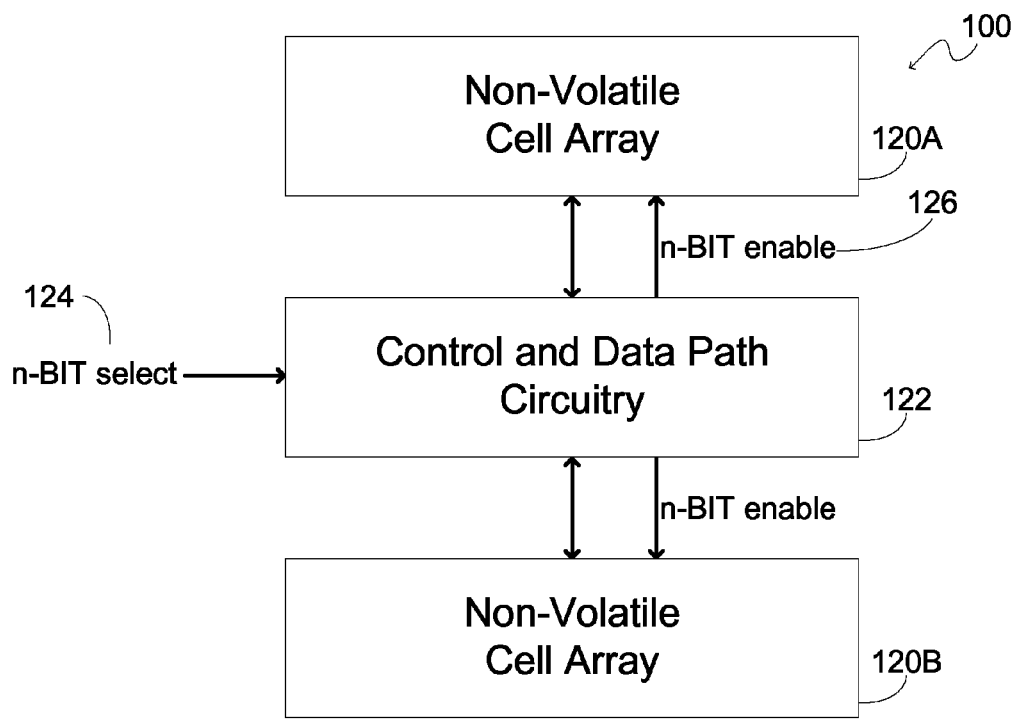
FIG. 1B is a block diagram for an embedded non-volatile memory block including a dual bank cell array.

FIG. 1B is a block diagram for an embedded non-volatile memory block 100. In the embodiment depicted, the embedded non-volatile memory block 100 has been broken in to a dual bank array so that non-volatile cell array 120A and non-volatile memory cell array 120B make up the available memory for the memory block 100. Also shown is control and data path circuitry 122 that provides control and communication functions for the memory array block 100.

It is shown in FIG. 1B that the control and data path circuitry 122 has an input n-BIT select 124 and an output n-BIT enable 126 for the memory array block 100. The output n-BIT enable 126 may be used to select which of the n-BIT elements are being used in a non-volatile memory cell operation. The input n-BIT select 124 may be an external signal which is used to select which of the n-BIT elements are being used in a non-volatile memory cell operation. It is noted that the actual circuitry implemented for the memory block 100 could vary depending upon the operational functionality desired.

Figure 2:
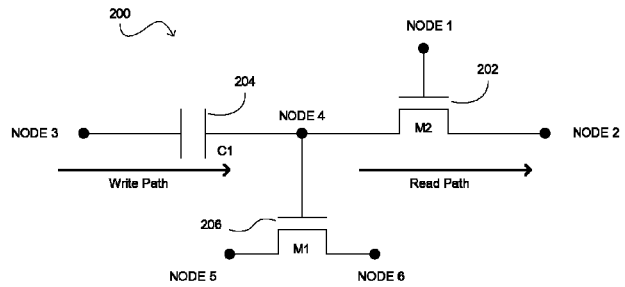
FIG. 2 is a circuit diagram of a one-time programmable non-volatile memory element including an antifuse element, a writing capacitor and an access transistor.

FIG. 2 is a circuit diagram for a one time programmable non-volatile memory element 200 according to an embodiment of the present invention including an antifuse element (M1) 206, a writing capacitor (C1) 204 and an access transistor (M2) 202. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the gate of antifuse element transistor M1. NODE 5 is connected to the source of the transistor M1, and NODE 6 is connected to the drain of transistor M1. It is noted that NODE 6 could be connected to the source of the transistor M1, and NODE 5 could be connected to the drain of transistor M1 as an alternate embodiment. As shown, the transistors are NMOS devices. It is noted that PMOS transistors or other device types could be utilized for the access device. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure. As shown, NODE 4 is connected to the gate of antifuse element transistor M1 and NODES 5/6 are connected to the source/drain of the antifuse element transistor M1, respectively. It is noted that NODE 4 could be connected to both the source and the drain of the antifuse element transistor M1 and NODES 5/6 could be connected together and to the gate of antifuse element transistor M1.

The non-volatile memory element 200 advantageously utilizes an antifuse element 206 that can be fabricated in standard CMOS processes without requiring special processing. This antifuse element 206 can be formed, for example, by using a standard gate oxide dielectric layer as an insulator. This insulator can then be made to become conductive by electrical means. For example, insulating layers, such as silicon dioxide ($SiO_2$), can have a voltage applied across them, and the insulator will not permit current to flow. If a sufficiently high field is applied, however, the oxide will breakdown and cause a fast discharge of the voltage to across the oxide. This rapid discharge usually results in a change in the oxide or damage to the oxide that eliminates its insulating characteristic, so that the oxide will now conduct electrical current. This change in resistivity or conductive state can be used to represent the logic state of the antifuse element.

To cause the dielectric layer to become conductive, a voltage of sufficient magnitude must typically be applied across the dielectric layer. Oxides will generally become conductive with exposure to high voltages where stress is induced and charge is conducted through the oxides. Thick oxides generally behave in a manner that is typical of insulators, that is, they will tolerate an increasing field until a certain high potential, and then the oxide will break down. Below this breakdown, there is only a small current (called Fowler-Nordheim tunneling). Then, at a certain voltage level, the current will rise sharply, and significant charge will flow through the oxide. If the current is large enough, damage will occur to the oxide, and the oxide will become conductive. In some cases, one breakdown event may not be enough to cause the oxide to change permanently to a conductive state. Rather, a series of breakdown events may be needed to cause the oxide to become conductive. In thinner oxides, there can be other modes of conduction, such as direct tunneling, and these currents may prevent the easy build up of voltage across the oxide. As the voltage increases, the current through the oxide will increase, and likewise the current will decrease if the voltage is decreased. These oxides must typically conduct a significant amount of charge before the insulating characteristics are lost. This charge to breakdown ($Q_{bd}$) must be driven through the insulator to cause it to change states, from an insulator to a conductor.

In particular, in the embodiment of FIG. 2, the transistor M1 is the dielectric layer breakdown device or antifuse element. In one example, NODES 5 and 6 can be held near zero volts or ground, and NODE 4 is driven to a high voltage for writing to the antifuse device M1. To drive NODE 4 to a high voltage level, a pre-charge step may be used in conjunction with a voltage boost step. In a pre-charge step, transistor M2 is used to charge up the programming NODE 4 to a first pre-charge voltage level. To effect this pre-charge step, a voltage, such as a voltage near the supply voltage (Vdd) or preferably to a pumped supply voltage (Vpp), is applied to NODE 2 of the access transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below thereby turning "off" the access transistor M2, and a Vpp level voltage pulse is applied to NODE 3 of capacitor C1. Due to the nature of capacitors, this action causes NODE 4 to rise along with NODE 3, thereby raising NODE 4 to a high level voltage, for example approximately 2-times Vpp or 2Vpp, assuming NODE 4 was pre-charged to a Vpp voltage level. Thus, this circuit configuration allows for raising the internal programming voltage within the non-volatile memory cell to a higher voltage, such as a voltage that is approximately 2-times the voltages being applied to the capacitor C1 and the access transistor M2.

In this write operation, therefore, the disclosed memory cell structure of FIG. 2 can double the applied voltage inside the memory element or cell 200. This capability of doubling the applied voltage in the cell is a significant benefit of the disclosed structure. This feature, therefore, allows the memory cell to be made without high voltage transistors throughout the design by confining the high voltage to a single node in the memory cell. This doubling within the cell allows the other circuitry that drives the memory core to operate at lower voltages, for example, at Vcc or Vpp. Special high voltage transistors are not required to deliver to the memory core the high voltages that are needed to write the memory elements. In the structure of FIG. 2, the high voltage appears across the dielectric layer of antifuse element M1 and is confined to NODE 4. In the example above, therefore, the voltage across the access transistor M2 and capacitor C1 is Vpp, and the voltage across the dielectric layer of the antifuse element M1 is 2Vpp. It is noted that the FIG. 2 depicts the use of an antifuse element M1 that is capable of being written to once because the dielectric layer breakdown is typically not reversible once it has occurred. However, the internal memory cell voltage doubling technique could also be used with other memory elements that could be re-writable, if desired. It is further noted that the voltage boosting technique could be utilized to drive the internal programming voltage of the non-volatile memory cell to even higher voltages that exceed a voltage that is double the voltage being applied to the capacitor or the access device for the non-volatile memory cell, if such higher voltages were desired for a particular implementation. In addition, the voltage boosting technique could also be used to generate internal programming voltages that are higher than the applied voltages but lower than double the applied voltages. In short, a wide range of elevated voltages could be achieved, as desired, utilizing the capacitor voltage boosting technique of the present invention.

To read the state of the antifuse element M1, a voltage is applied across the antifuse element and then read circuitry will detect if there is a current flow through the dielectric layer of the antifuse element. For example, NODE 2 can be driven to an initial voltage, such as 1 volt, and NODE 1 can be driven to a positive voltage, such as Vdd. If the dielectric layer within the antifuse element M1 is conducting, a current will flow from NODE 2, through transistor M2 to NODE 4 and then to NODE 5 and/or NODE 6 through the dielectric layer of antifuse element M1. If the dielectric layer within the antifuse element M1 is not conducting, then there would be no current flowing from NODE 2 to NODE 5 and/or NODE 6 of the antifuse element M1. The current flow determination and the no current flow state are then used to determine the resistivity state of the antifuse element and thereby to determine the logic state of the non-volatile memory cell 200. For example, dielectric layer breakdown and associated current flow could define a logic "1," and no current flow could define a logic "0." In the embodiment of FIG. 2, the transistor M2 is the access transistor connected to NODE 4.

In an alternative embodiment, the transistor M2 is used as the access transistor, but is connected to NODES 5 and 6. In this alternative embodiment, NODES 5 and 6 of the antifuse element are connected together and to NODE 4, and NODE 2 is coupled to NODES 5 and 6 through the access transistor M2. Details on the manner in which an antifuse element may be implemented in CMOS technologies are described in co-pending application Ser. No. 12/887,956, filed Sep. 22, 2010 and entitled "NON-VOLATILE MEMORY ELEMENT INTEGRATABLE WITH STANDARD CMOS CIRCUITRY," which is incorporated herein by reference in its entirety.

As indicated above with respect to FIGS. 1A and 1B, the memory cell structure 200 of FIG. 2 can be used in an array of write-once memory cells and the read selection of an individual cell can be done by the respective voltages applied to the NODE 1 and NODE 2 of the individual cells. For example, NODE 1 could be used to select a row of non-volatile memory cells in an array, while the column could be selected by NODE 2. Row and column selection circuitry that may be used with the memory cell structure 200 of FIG. 2 is described in commonly owned U.S. Pat. No. 6,775,197, which is incorporated by reference herein in its entirety.

Figure 3:
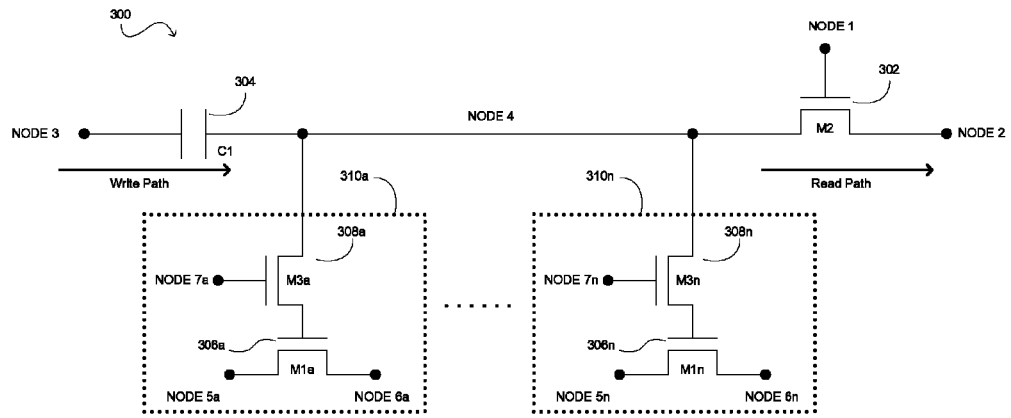
FIG. 3 is a circuit diagram of a multiple time programmable non-volatile memory element according to one embodiment of the present invention including a n-BIT select element, an antifuse element, a writing capacitor, and an access transistor.

FIG. 3 is a circuit diagram for a multiple time programmable non-volatile memory element 300 according to one embodiment of the present invention that includes a writing capacitor (C1) 304 and an access transistor (M2) 302. The non-volatile memory element also includes a n-BIT select element (M3a) 308a, and an antifuse element (M1a) 306a that together form a memory cell 310a. The non-volatile memory element 300 may include a plurality of memory cells 310a-310n, each of which include an n-BIT select element (M3n) 308n, and an antifuse element (M1n) 306n to make the cell a multiple time programmable memory element. The number of times the memory element 300 may be programmable is equal to n. For example, if n equals 2 then the memory element is comprised of two memory cells 310 (e.g., 310a, 310b), each of which includes an n-BIT select element 308 and an antifuse element 306, where each memory cell (310a, 310b) may be programmed one time, which makes the memory element a two times programmable memory element. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the drain of the n-BIT select transistor M3. The source of the n-BIT select transistor M3 is connected to the gate of antifuse element transistor M1. NODE 5 is connected to the source of the transistor M1, and NODE 6 is connected to the drain of transistor M1. NODES 7a through NODE 7n are connected to the gates of the n-BIT select elements M3a through M3n. These gates are then used to control or select which of the n antifuse elements are being used during the operation. As shown, the transistors are NMOS devices. It is noted that PMOS transistors or other device types could be utilized for the devices. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure.

In particular, in the embodiment of FIG. 3, the transistors M1a through M1n are the dielectric layer breakdown device or antifuse element. In one example, NODES 5a-5n and 6a-6n can be held near zero volts or ground, and NODE 4 is driven to a high voltage for writing to one or more of the antifuse devices M1a through M1n. The antifuse element that is written is selected by the n-BIT select signals which are connected to the gates of the n-BIT select transistors M3a through M3n.

Figure 4:
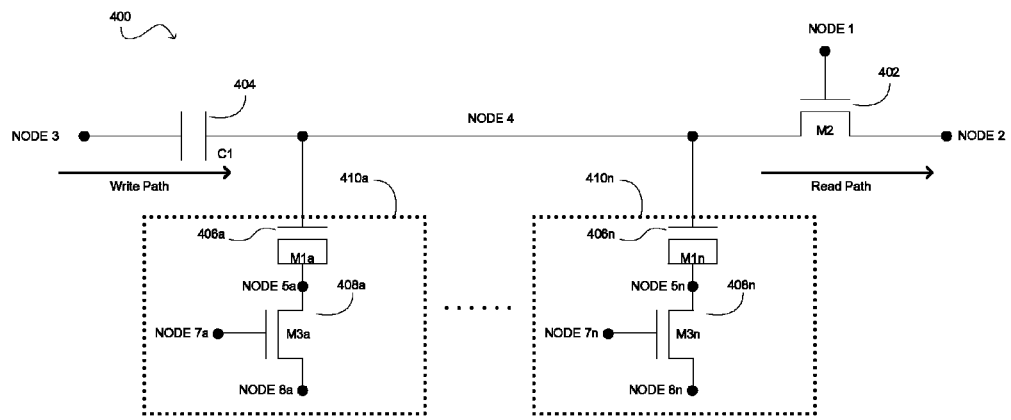
FIG. 4 is a circuit diagram of a multiple time programmable non-volatile memory element according to another embodiment of the present invention including a n-BIT select element, an antifuse element, a writing capacitor, and an access transistor.

FIG. 4 is a circuit diagram of a multiple time programmable non-volatile memory element 400 according to another embodiment of the present invention that includes a writing capacitor (C1) 404 and an access transistor (M2) 402. The non-volatile memory element also includes a n-BIT select element (M3a) 408a, and an antifuse element (M1a) 406a that together form a memory cell 410a. The non-volatile memory element includes a plurality of memory cells 410a-410n, each of which includes an n-BIT select element (M3n) 408n, and an antifuse element (M1n) 406n to make the cell a multiple time programmable memory element. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the gate of the antifuse element transistor M1. Each of NODES 5a through 5n is respectively connected to the source and drain of the transistor M1a through M1n and to the drain of the n-BIT select transistor M3a through M3n. Each of NODES 7a through 7n is respectively connected to the gates of the n-BIT select elements or transistors M3a through M3n. These gates are the used to control or select which of the n antifuse elements are being used during the operation. As shown, the transistors are NMOS devices. It is noted that PMOS transistors or other device types could be utilized for the devices. The capacitor C1 may be a MOS transistor connected such that the gate provides one terminal of the capacitor C1 and such that the source and drain are connected together to provide the other terminal of the capacitor C1. The capacitor C1 could also be formed by using two conductive layers of metal or polysilicon and a dielectric layer to form a capacitor structure.

The present invention may be used to program multiple elements per bit to add redundancy or increase the breakdown conduction for higher reliability applications. This may be accomplished by selecting one or more of the n-BIT select signals during the memory operations. In particular, in the embodiment of FIG. 3, the transistors M1a through M1n are the dielectric layer breakdown device or antifuse element. In one example, NODES 5a-5n and 6a-6n can be held near zero volts or ground, several NODES 7a through 7n connected to the n-BIT select devices M3a through M7a can be held high, and NODE 4 is driven to a high voltage for writing to one or more of the antifuse devices M1a through M1n. This will program multiple antifuse elements per bit to add redundancy or increase the breakdown conduction for higher reliability applications.

Advantageously, therefore, the benefits of the multiple time programmable non-volatile embedded memory cell structures described herein include: (1) a programming voltage generated internally to the memory cell, (2) no high voltage transistors needed for routing the high programming voltage to the memory cell, (3) unique selection of the memory cell is possible through the use of NODE 1 and NODE 2, (4) one or more times programmable memory cell, (5) capability to increase the breakdown conduction for higher reliability applications, and/or (5) no special structures, special processing techniques and/or process modifications are required to integrate the non-volatile memory cell structure with other CMOS circuitry.

Having thus described several aspects of at least one embodiment of this invention, it is to be appreciated various alterations, modifications, and improvements will readily occur to those skilled in the art. For example, equivalent elements may be substituted for those illustrated and described herein and certain features of the invention may be utilized independently of the use of other features, all as would be apparent to one skilled in the art after having the benefit of this description of the invention. Such alterations, modifications, and improvements are intended to be part of this disclosure, and are intended to be within the scope of the invention. Accordingly, the foregoing description and drawings are by way of example only.

The invention claimed is:

1. A non-volatile memory, comprising:
a plurality of multiple time programmable non-volatile memory elements, each respective multiple time programmable non-volatile memory element including:
a capacitor;
an access transistor electrically coupled to the capacitor at a connection node; and
a plurality of one time programmable non-volatile memory cells corresponding in number to a number of times the respective multiple time programmable non-volatile memory element can be programmed to have a logic state that is either one of a first logic state and a second logic state that is logically opposite the first logic state, each of the plurality of one time programmable non-volatile memory cells being electrically coupled in parallel with one another to the connection node and including a select transistor that is electrically coupled to an antifuse element, the antifuse element being configured to have changed resistivity in response to one or more voltage pulses received at the connection node, the change in resistivity representing a change in the logic state of the respective multiple time programmable non-volatile memory element.

2. The non-volatile memory of claim 1, wherein the select transistor is electrically coupled between the connection node and the antifuse element in each of the plurality of one time programmable non-volatile memory cells.

3. The multiple time programmable non-volatile memory element of claim 2, wherein the antifuse element is an antifuse element transistor having a gate that is connected to the select transistor in each of the plurality of one time programmable non-volatile memory cells.

4. The multiple time programmable non-volatile memory element of claim 2, wherein the select transistor has a drain and a source, and wherein the drain of the select transistor is connected to the connection node and the source of the select transistor is connected to the antifuse element in each of the plurality of one time programmable non-volatile memory cells.

5. The multiple time programmable non-volatile memory element of claim 4, wherein the antifuse element is an antifuse element transistor having a gate that is connected to the source of the select transistor in each of the plurality of one time programmable non-volatile memory cells.

6. The multiple time programmable non-volatile memory element of claim 5, wherein each respective one time programmable non-volatile memory cell of the plurality of programmable non volatile memory cells of the respective multiple time programmable non-volatile memory element can be individually selected and programmed to have either one of the first logic state and the second logic state independently of any other one time programmable non-volatile memory cell of the plurality of one time programmable non-volatile memory cells of the respective multiple time programmable non-volatile memory element.

7. The multiple time programmable non-volatile memory element of claim 4, wherein the antifuse element is an antifuse element transistor having a source and a drain that are connected together and to the source of the select transistor in each of the plurality of one time programmable non-volatile memory cells.

8. The multiple time programmable non-volatile memory element of claim 1, wherein one of a source and a drain of the access transistor is electrically coupled to the capacitor at the connection node.

9. The multiple time programmable non-volatile memory element of claim 1, wherein the antifuse element is electrically coupled between the connection node and the select transistor in each of the plurality of one time programmable non-volatile memory cells.

10. The multiple time programmable non-volatile memory element of claim 9, wherein the antifuse element is an antifuse element transistor having a gate, a source and a drain, and wherein the gate of the antifuse element transistor is connected to the connection node and the source and drain of the antifuse element transistor are connected together and to the select transistor in each of the plurality of one time programmable non-volatile memory cells.

11. The multiple time programmable non-volatile memory element of claim 10, wherein the select transistor has a source and a drain, and wherein one of the source and the drain of the select transistor is connected to the source and drain of the antifuse element in each of the plurality of one time programmable non-volatile memory cells.

12. The multiple time programmable non-volatile memory element of claim 10, wherein the select transistor has a source and a drain, and wherein the drain of the select transistor is connected to the source and drain of the antifuse element in each of the plurality of one time programmable non-volatile memory cells.

13. The multiple time programmable non-volatile memory element of claim 12, wherein each respective one time programmable non-volatile memory cell of the plurality of programmable non volatile memory cells of the respective multiple time programmable non-volatile memory element can be individually selected and programmed to have either one of the first logic state and the second logic state independently of any other one time programmable non-volatile memory cell of the plurality of one time programmable non-volatile memory cells of the respective multiple time programmable non-volatile memory element.

14. The multiple time programmable non-volatile memory element of claim 1, wherein each respective one time programmable non-volatile memory cell of the plurality of programmable non volatile memory cells of the respective multiple time programmable non-volatile memory element can be individually selected and programmed to have either one of the first logic state and the second logic state independently of any other one time programmable non-volatile memory cell of the plurality of one time programmable non-volatile memory cells of the respective multiple time programmable non-volatile memory element.

\* \* \* \* \*

UNITED STATES PATENT AND TRADEMARK OFFICE
CERTIFICATE OF CORRECTION

PATENT NO. : 8,199,590 B1  
APPLICATION NO. : 12/889653  
DATED : June 12, 2012  
INVENTOR(S) : Walter Novosel et al.

It is certified that error appears in the above-identified patent and that said Letters Patent is hereby corrected as shown below:

On the Title Page, Related U.S. Application Data:

item (60), replace "61/244,791" with "61/245,791";

column 1, line 7, replace "61/244,791" with "61/245,791".

Signed and Sealed this  
Twenty-eighth Day of August, 2012

David J. Kappos  
*Director of the United States Patent and Trademark Office*